United States Patent [19]

Jungroth

[11] Patent Number: 4,875,188
[45] Date of Patent: Oct. 17, 1989

[54] VOLTAGE MARGINING CIRCUIT FOR FLASH EPROM

[75] Inventor: Owen W. Jungroth, Sonora, Calif.

[73] Assignee: Intel Corporation, Santa Clara, Calif.

[21] Appl. No.: 144,567

[22] Filed: Jan. 12, 1988

[51] Int. Cl.⁴ ............... G11C 11/34; G11C 11/00; G11C 7/00; H02J 1/10

[52] U.S. Cl. ................... 365/185; 365/148; 365/218; 365/177; 307/28; 307/29

[58] Field of Search ............... 365/182, 185, 189, 148, 365/149, 218, 226, 189.01, 189.09, 230.01, 177; 307/28, 29; 357/23.5, 23.6, 43

[56] References Cited

U.S. PATENT DOCUMENTS

| | | | |
|---|---|---|---|
| 4,460,982 | 7/1984 | Gee et al. | 365/218 |
| 4,503,524 | 3/1985 | McElroy | 365/218 |
| 4,694,430 | 9/1987 | Rosier | 365/189 |
| 4,720,816 | 1/1988 | Matsuoka et al. | 365/189 |

OTHER PUBLICATIONS

"A 256-K Bit Flash E² Prom Using Triple-Polysilicon Technology", IEEE Journal Solid-State Circuits, vol. SC-22, No. 4, Aug. 1987, (pp. 548-552).

*Primary Examiner*—Stuart N. Hecker
*Assistant Examiner*—Melissa J. Koval
*Attorney, Agent, or Firm*—Blakely, Sokoloff, Taylor & Zafman

[57] ABSTRACT

A circuit is described for providing internal voltage margining for a flash EPROM to verify erasing and programming. Matched transistors are used to develop the internal margined voltage so as to provide a potential which is substantially independent of process variations. Different potentials are used to verify programming and erasing.

15 Claims, 2 Drawing Sheets

FIG_1
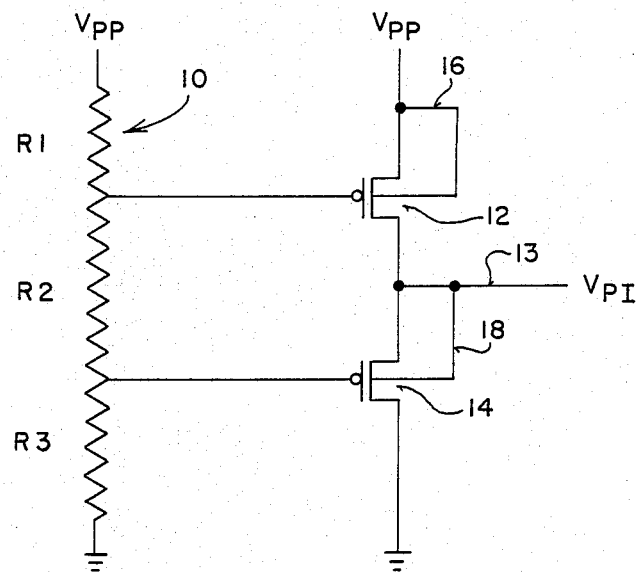
FIG_2
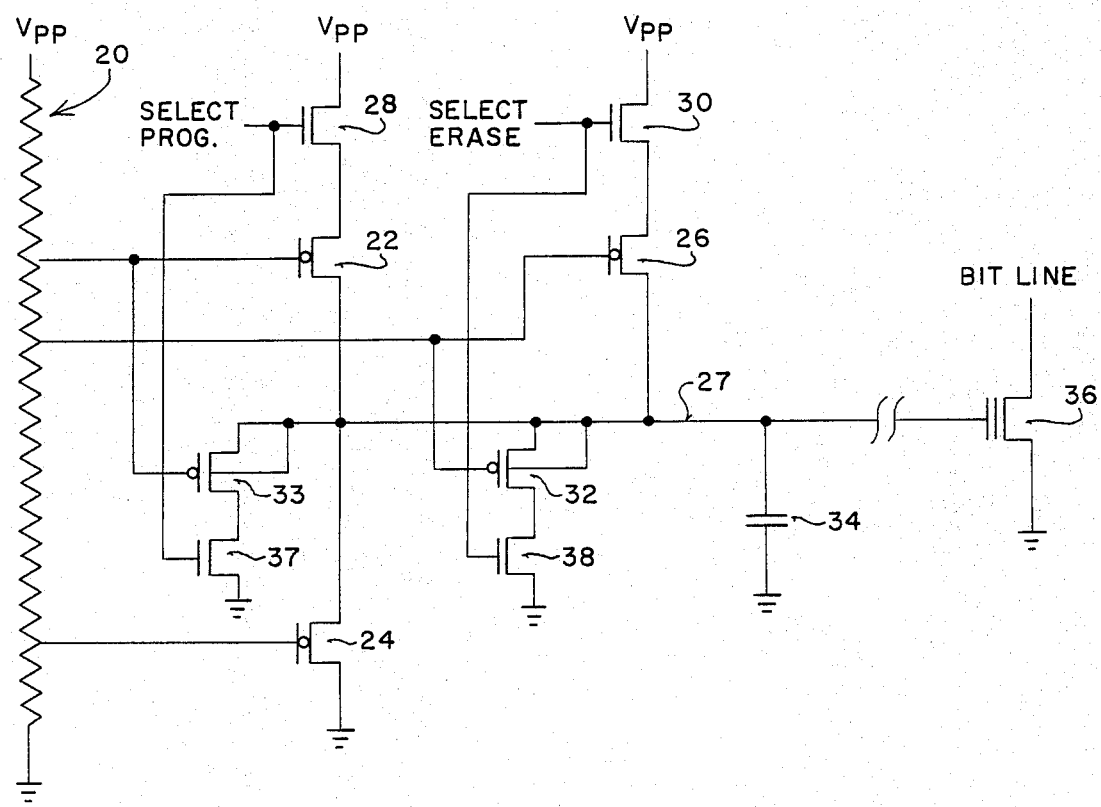

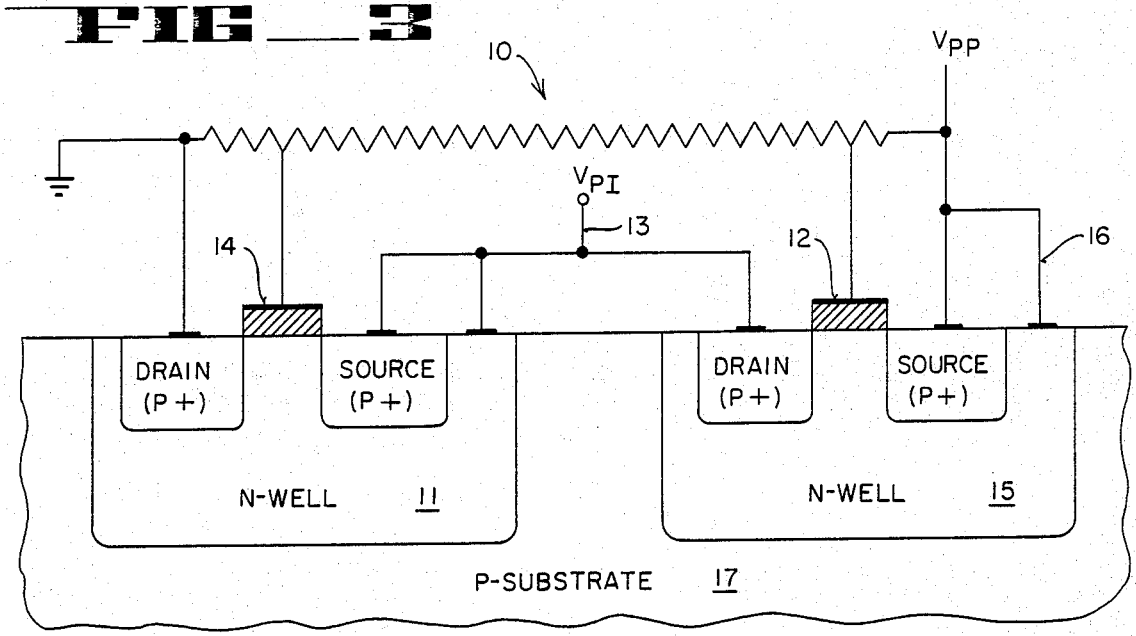
FIG_3
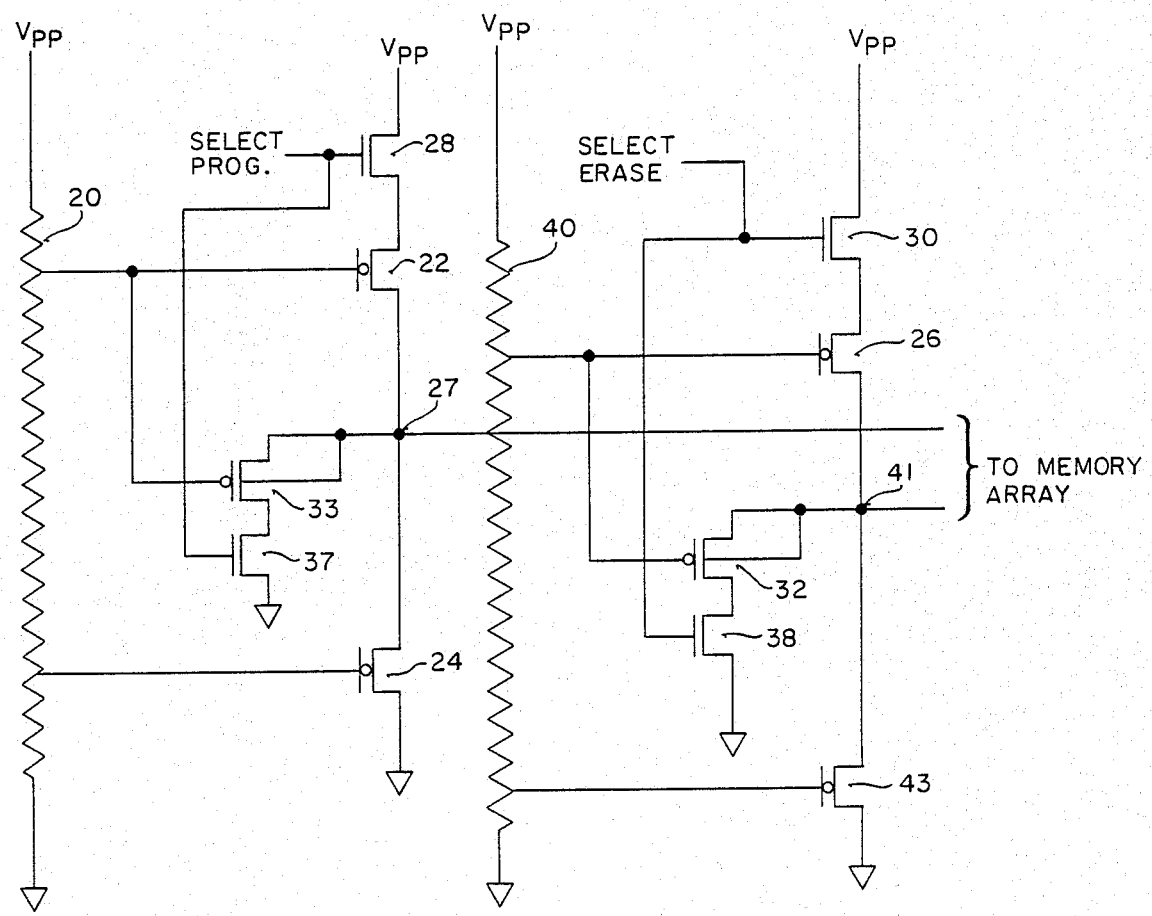
FIG_4

VOLTAGE MARGINING CIRCUIT FOR FLASH EPROM

BACKGROUND OF THE INVENTION

1. Field of the Invention

The invention relates to the field of metal-oxide-semiconductor (MOS) electrically programmable and electrically erasable read-only memories (EEPROMs) having floating gates and to electrically programmable read-only memories (EPROMs).

2. Prior Art

The most commonly used EPROM cell has an electrically floating gate which is completely surrounded by insulation and generally disposed between a source and drain region formed in a silicon substrate. In early versions of these cells, charge is injected through the insulation by avalanche injection such as the device described in U.S. Pat. No. 3,660,819. Later versions of EPROMs relied on channel injection for charging the floating gate as shown in U.S. Pat. Nos. 4,142,926; 4,114,255 and 4,412,310. These EPROMs are erased by exposing the array to ultraviolet radiation.

Electrically erasable EPROMs (EEPROMs) are also commercially available. In some cases, charge is placed into and removed from a floating gate by tunnelling the charge through a thin oxide region formed on the substrate (see U.S. Pat. No. 4,203,158). In other instances, charge is removed through an upper electrode (see U.S. Pat. No. 4,099,196).

More recently, a new category of electrically erasable EPROMs has emerged sometimes referred to as "flash" EPROMs or EEPROMs. In these memories, the entire array is simultaneously erased, electrically. The cells themselves use only a single device per cell and such cells are described in copending application, Ser. No. 892,446, filed Aug. 4, 1986, entitled "Low Voltage EEPROM Cell". The present invention is directed towards use of these cells.

EPROM memories most often removed from their printed circuit boards for both erasing and programming. A special programming device is used for programming the cells. This device verifies that the cells have been properly programmed by raising the $V_{CC}$ potential to approximately 6.25 volts for a "5 volt" memory. If "zeroes" can be read at 6.25 volts, it is then assumed that the zeroes will be able to be read over the life of the memory at a $V_{CC}$ potential of 5.5 volts. (This should be the highest voltage the memory encounters when properly used with a regulated 5 volt power supply.) During programming, electrons are transferred to the floating gate making the cells less conductive. If the application of the 6.25 volts to the control gate causes the cell to remain non-conductive during a read cycle, sufficient negative charge has been transferred to the floating gate so that the device will operate satisfactorily over its life.

EEPROMs are typically programmed and erased while installed in the same circuit (e.g., printed circuit board) used for reading data from the memory. That is, a special programming device is not needed. In some cases "on chip" circuits are used to verify that the programming has been properly performed.

Electrically erasing some floating gate device gives rise to another problem, specifically overerasing. Too much charge can be removed, making the device "depletion-like". Cells may require testing after being erased to verify that the floating gate is erased, but not too positively charged.

U.S. Pat. No. 4,460,982 disclosed an "intelligent" EEPROM which provides means for verifying both programming and erasing.

The closest prior art known to Applicant is an article entitled "A 256-k Bit Flash E$^2$PROM Using Triple-Polysilicon Technology" IEEE Journal Solid-State Circuits. Vol. SC-22, No. 4, August, 1987 and the above mentioned U.S. Pat. No. 4,460,982.

SUMMARY OF THE INVENTION

An improvement for verifying erasing and programming in an electrically erasable and electrically programmable read-only memory cell fabricated on a silicon substrate which employs a plurality of memory cells each of which contains a floating gate is described. A first circuit means incorporated on the substrate is coupled to the programming potential and provides a first potential (first margined potential) lower than the programming potential. This first potential is coupled to the cells to verify that the cells are properly programmed. This first circuit means includes a pair of matched transistors coupled in series with their gates coupled to a resistor. A second circuit means also incorporated on the substrate provides a second potential lower than the first potential, the second potential (second margined potential) is used to verify that the cells have erased. The second circuit means may again comprise a pair of matched transistors. In the presently preferred embodiment, the first and second circuit means share a transistor and use transistors having a threshold voltage of zero volts.

BRIEF DESCRIPTION OF THE DRAWINGS

FIG. 1 is an electrical schematic showing the voltage margining circuit of the present invention.

FIG. 2 is an electrical schematic of the presently preferred embodiment of the invention.

FIG. 3 is an electrical schematic of the present invention showing the cross-sectional relationship of the field-effect devices.

FIG. 4 is an electrical schematic of an alternative embodiment of the present invention.

DETAILED DESCRIPTION OF THE PRESENT INVENTION

An improvement for verifying the erasing and programming of an electrically erasable and electrically programmable read-only memory cell is described. In the following description numerous specific details are set forth such as specific conductivity types in order to provide a thorough understanding of the present invention. In other instances, well-known fabrication techniques for fabricating the circuits are not described in detail in order not to unnecessarily obscure the present invention in detail.

In its currently preferred embodiment, the circuit of the present invention is fabricated along with the entire memory cell on a p-type silicon substrate. Ordinary metal-oxide-semiconductor (MOS) processing is employed and more specifically, complementary MOS technology is used to fabricate the present invention where n-type devices are formed in the substrate and p-type devices are formed in nwells, the n-wells being first formed in the substrate.

The memory cells employed in the presently preferred embodiment include floating gates which are separated from the channel region by an oxide thickness of approximately 110°. A control gate which is fabricated from a second layer of polysilicon overlies the floating gate. The floating gate is charged by the channel injection of electrons into the floating gate and discharged by the tunnelling of charge from the floating gate through the gate oxide. The details of the fabrication of the cell are described in copending application, Ser. No. 892,446, filed Aug. 4, 1986, entitled "Low Voltage EEPROM Cell", which application is assigned to the assignee of the present invention.

The flash EPROM memory fabricated with the cells described above receives an externally generated erasing/programming potential ($V_{PP}$) of approximately 12 volts and a $V_{CC}$ potential of 5 volts for normal reading operations. The circuits of FIGS. 1 and 2 are coupled to the $V_{PP}$ potential and used to generate an internal margin voltage which allows verification of programming and erasing.

Referring first to FIG. 1, a resistor 10 is formed in the substrate. In the currently preferred embodiment, this resistor comprises an n-well region fabricated in the p-type substrate. This resistor is coupled between the $V_{PP}$ potential and ground.

A pair of p-type matched field-effect transistors 12 and 14 are coupled in series between the $V_{PP}$ potential and ground. These transistors are matched in that they both have the same channel width and length and are fabricated close to one another on the substrate so that they are both subjected to the same processing. Since the process variations between these two transistors will be very slight, they both have the same threshold voltage (except for body effect discussed later). In the currently preferred embodiment, the transistors 12 and 14 are fabricated in different n-type wells for reasons which shall be explained.

The internal margin (regulated) potential $V_{PI}$ is generated at the node between transistors 12 and 14 on line 13. The gates of transistors 12 and 14 are coupled to the resistor 10 and as illustrated a resistance $R_1$ is present between the gate of transistor 12 and the VPP potential, a resistance R2 between the gates of the transistors 12 and 14, and a resistance R3 between the gate of transistor 14 and ground.

Assume that the capacitance associated with line 13 has been charged then the same current flows through the transistors 12 and 14. If the transistors are in saturation and their threshold voltages are equal, their gate source voltages cancel each other. The potential $V_{PI}$ equals the voltage across $R_2$: The resistances R1, R2 and R3 can be accurately determined. The externally generated $V_{PP}$ can be carefully regulated. Since the thresholds of transistors 12 and 14 are cancelled, the internally generated potential $V_{PI}$ remains constant from chip-to-chip and this can be used to verify erasing and programming. That is, the matched transistors provide compensation for process variation as well as temperature variation.

The threshold voltages of transistors 12 and 14 will not be equal even if the transistors are matched, if they are both fabricated directly in the substrate or in a common well. The reason for this is that the source of transistor 12 is at a higher potential than the source of transistor 14; the body effect associated with these different potentials will cause the transistors to have different threshold voltages. To solve this problem, each of the transistors are fabricated in separate n-wells and the wells are connected so as to cancel this body effect. The wells are connected to the source terminals of their respective transistor. Specifically, the n-well associated with transistor 12 is connected to the $V_{PP}$ potential as indicated by line 16 and the n-well associated with the transistor 14 is connected to the line 13 as indicated by line 18. FIG. 3 illustrates a cross-sectional view of the semiconductor circuit of FIG. 1 in which n-wells 11 and 15, associated with devices 14 and 16, respectively, are disposed in a p-type substrate 17. Both n-wells are shown connected as described above.

One problem associated with the circuit of FIG. 1 is that if $V_{PP}$ is brought to ground and line 13 is coupled to $V_{CC}$, forward bias junctions will be present through the drain of transistor 12. In the currently preferred embodiment, the output node (line 13) is connected to $V_{CC}$ during read operations and the $V_{PP}$ potential is not present. Hence, forward biased junctions will be present. This problem is solved, however, with the circuit of FIG. 2 where n-type transistors are used for transistors 12 and 14.

Referring now to FIG. 2, the circuit again includes a resistor, resistor 20 formed from an n-type region. Effectively, two pairs of matched transistors are used in FIG. 2, one comprising transistors 22 and 24, and the other, transistors 26 and 24. That is, transistor 24 is shared by both transistors 22 and 26. The transistors 22, 24 and 26 are matched in that they have the same width and length dimensions and are fabricated in the same general substrate area as described in conjunction with transistors 12 and 14 of FIG. 1. The transistors 22, 24 and 26 have a threshold voltage approximately equal to 0 volts (they are formed in the p-type substrate with no threshold adjusting implant into the channel regions). The gates of these transistors are coupled to the resistor 20. (These zero threshold voltage transistors are indicated with a 0 between the gate and substrate whereas the p-type transistors are shown with a 0 above the gate.)

An ordinary n-type field-effect transistor 28 is coupled between one terminal of transistor 22 and the $V_{PP}$ potential. When a select signal is applied to the gate of transistor 28, current flows from the $V_{PP}$ potential through transistors 22 and 24 to ground. Similarly, an n-type transistor 30 is coupled between one terminal of transistor 26 and the $V_{PP}$ potential. When transistor 30 conducts, a current flows through transistors 26 and 24 to ground. Note either transistor 28 or transistor 30 are selected, or neither, but not both at the same time. The output node of the circuit of FIG. 2, line 27 corresponds to line 13 of FIG. 1. The parasitic capacitance associated with the gates of the cells is shown as capacitor 34. The line 27 is selectively coupled to cells to verify programming and erasing, one such cell 36 is shown in FIG. 2. In the alternative embodiment of FIG. 4 the circuit of FIG. 2 is shown divided into two separate circuits. The first circuit is used to verify programming and comprises a pair of transistors 22 and 24 coupled in series with their gates being coupled to a first resistor 20. The second circuit is used to verify erasing and comprises transistors 26 and 43 coupled in series with their gates being coupled to a second resistor 40. The output nodes of the first and second circuits are shown in FIG. 4 as lines 27 and 41, respectively.

Consider, once again, the operation of the circuit of FIG. 2.

Assume now that the cells in the array are being programmed and it is necessary to verify that the programming is complete. The $V_{PP}$ potential of 12 volts is present and the transistor 28 conducts since the select programming potential is high. The gate of transistor 22 is coupled to resistor 20 so as to provide a potential of approximately 7.5 volts on line 27 as described in conjunction with FIG. 1. This potential is coupled to each of the cells when it is read. Those cells which have been programmed with a "0" are checked to verify that they in fact indicate that they have been programmed with a 0. (If an insufficient amount of charge is transferred to the floating gate, conduction occurs. The cell then appears to be programmed with a one not a zero.) Additional programming occurs followed by verification for cells not fully programmed.

Assume now that the cells in the array are being erased and it is necessary to verify that the erasing is complete. The VPP potential of 12 volts is present and the transistor 30 conducts since the select erase potential is high. The gate of transistor 26 is coupled to resistor 20 so as to provide a potential of approximately 3.25 volts on line 27. This potential is coupled to each of the cells when it is read. Those cells which have been erased with a "1" are checked to verify that they in fact indicate that they have been erased with a 1. (If an insufficient amount of charge is removed from the floating gate, no conduction occurs. The cell then appears to be programmed with a zero not a one.) Additional erasing occurs followed by verification if any cell is not fully erased.

The margined potentials described above for verifying erasing and programming are substantially independent of process and temperature variations. This is important since these verifications are conducted to verify conditions with marginal voltage supplies such as those that may be encountered by the memory during its actual use.

In order to meet timing requirements of the chip, the verify voltage reference described here must be able to change the voltage on line 27 quickly despite the large capacitance associated with device 34. When going into a verify operation (either erase or program verify) the voltage on line 27 could be anywhere between 0 volts and VPP (about 12 volts). If the voltage on line 27 is below the verify voltage it will be pulled up to the verify voltage by transistor 22 for program verify or transistor 26 for erase verify. Since these transistors are connected in a source follower configuration this will be done quickly since the output resistance of a source follower is low making the RC delay time small. However, if the line 27 beings higher than the verify voltage transistors 22 and 26 will be off and transistor 24 will have to pull the line down. Transistor 24 is connected in a current source configuration and its output resistance is high, causing a large RC delay time to pull down. The addition of transistors 32 and 33 solves this problem. These transistors are also connected as source followers. Since they are P-type devices they will pull line 27 down if it begins above the verify voltage in the same quick manner that devices 22 and 26 pull it up. When the voltage on line 27 is pulled down to within a P device threshold of the verify voltage transistors 33 and 32 will turn off and will thus not effect the final verify voltage level. Transistors 37 and 38 perform a select function similar to devices 28 and 30.

A circuit using matched transistors in a load line is disclosed in copending application Ser. No. 144,569, filed 1/12/88, entitled "Load Line for Flash EPROM, which application is assigned to the assignee of the present invention.

Thus, a circuit for providing voltages which are substantially independent of process and temperature variations for verifying erasing and programming in flash EPROMs has been described.

I claim:

1. An electrically erasable and electrically programmable read-only memory fabricated on a silicon substrate and having a plurality of memory cells each of which has a floating gate, an improvement for verifying erasing and programming comprising:

first circuit means incorporated on said substrate for providing a first potential lower than the potential used for programming said cells, said first potential being coupled to said cells to verify that said cells have been programmed, said first circuit means comprising: first and second field-effect transistors coupled in series and matched to one another; a first resistor means coupled to a programming potential for developing said first potential and a bias potential, the gates of said first and said second transistors being coupled to said first resistor means such that the gate of said first transistor is approximately at said first potential and the gate of said second transistor is at said bias potential, a first node disposed between said first transistor and said second transistor providing said first potential, second circuit means incorporated on said substrate for providing a second potential lower than said first potential, said second potential being coupled to said cells to verify that said cells have been erased, said second circuit comprising: third and fourth field-effect transistors coupled in series and matched to one another; a second resistor means coupled to a programming potential for developing said second potential and a second bias potential, the gates of said third and said fourth transistors being coupled to said second resistor means such that the gate of said third transistor is approximately at said second potential and the gate of said fourth transistor is at said second bias potential; said second potential being provided at a second node disposed between said third and fourth transistors;

a selection means for selecting said first circuit means to transfer said first potential from the gate of said first transistor to said first node to verify that said cells have been programmed, and for selecting said second circuit means to transfer said second potential from the gate of said third transistor to said second node to verify that said cells have been erased.

2. The improvement defined by claim 1 wherein said silicon substrate is of a first conductivity type and, said first, second, third and fourth transistors are formed in wells of a second conductivity type, and wherein one of said wells is connected to said programming potential, and another of said wells is connected to said second node.

3. The improvement defined by claim 1 wherein said field-effect transistors have a threshold voltage of approximately 0 volts.

4. The improvement defined by claims 1 or 2 wherein said first and said second resistance means comprises a resistor formed in said silicon substrate in a region of said second conductivity type.

5. An electrically erasable and electrically programmable read-only memory fabricated on a silicon substrate and employing a plurality of memory cells each of which has a floating gate, an improvement for verifying erasing and programming comprising:

resistive means formed in said substrate and coupled to a programming potential for developing first intermediate, second intermediate, and bias potentials, said first intermediate potential being lower than said programming potential;

first and second matched transistors coupled in series between said programming potential and ground, the gates of said first and second transistors being coupled to said resistive means such that the gate of said first transistor is approximately at said first intermediate potential and the gate of said second transistor is at said bias potential, said bias potential being lower than said first and said second intermediate potentials, said first and second transistors providing a first potential on a node disposed between said first and second transistors;

a third transistor coupled between said programming potential and said node, said third transistor being matched with said first and second transistors, the gate of said third transistor being coupled to said resistive means such that the gate of said third transistor is approximately at said second intermediate potential, said third transistor providing said second intermediate potential on said node said second intermediate potential being lower than said first intermediate potential;

first selection means for transferring said first intermediate potential from the gate of said first transistor to said node to verify that cells have been programmed;

second selection means for transferring said second intermediate potential from the gate of said third transistor to said node to verify that said cells have been erased.

6. The improvement defined by claim 5 wherein said first, second and third transistors have a threshold voltage approximately equal to 0 volts.

7. The improvement defined by claim 6 wherein said substrate is p-type and further including fourth and fifth p-type transistors formed in an n-type well, said well being coupled to said node, the gates of said fourth and fifth transistors being coupled to the gates of said first and third transistors, respectively:

said fourth and said fifth transistors also being coupled to said node in a source follower configuration to facilitate rapid discharge of a previously stored potential on said node.

8. The improvement defined by claim 7 wherein said first and second transistors are formed in said first and second n-type wells, respectively, said first well being coupled to said programming potential and said second well being coupled to said node.

9. The improvement defined by claim 8 wherein said first and second transistors have threshold voltages approximately equal to 0 volts.

10. In an electrically erasable and electrically programmable read-only memory array fabricated on a silicon substrate, an improvement for verifying erasing and programming of a plurality of memory cells comprising:

first and second field-effect transistors coupled in series;

a node disposed between said first and said second transistors for providing a first internal margin potential to said plurality of memory cells;

a third field-effect transistor also coupled to said node;

a resistor means coupled between a programming potential and ground for generally developing said first internal margin potential at the gate of said first transistor, a second internal margin potential at the gate of said third transistor and a third potential at the gate of said second transistor, said first internal margin potential being higher than said second internal margin potential, and said second internal margin potential being higher than said third potential;

a first selection means for transferring said first internal margin potential from the gate of said first transistor to said node to verify that said cells have been programmed;

a second selection means for transferring said second internal margin potential from the gate of said third transistor to said node to verify that said cells have been erased.

11. The improvement of claim 10 wherein said first, said second and said third transistors are matched.

12. The improvement of claim 11 wherein said first and third transistors are connected in a source follower configuration and said second transistor is connected in a current source configuration.

13. The improvement of claim 12 further comprising fourth and fifth field-effect transistors having their gates coupled to said first and said third transistors, respectively, said fourth and fifth transistors being p-type devices connected as source followers to said node to facilitate rapid discharge of a previously stored potential on said node.

14. The improvement of claim 13 wherein said first selection means comprises a first n-type field-effect transistor coupled in series between said first transistor and said programming potential, and a second n-type field-effect transistor coupled in series between said fourth transistor and ground, said n-type transistors having their gates coupled together such that when their gates are raised to a positive potential said first internal margin potential is transferred to said node to verify programming.

15. The improvement of claim 14 wherein said second selection means comprises a third n-type transistor coupled in series between said third transistor and said programming potential, and a fourth n-type transistor coupled in series between said fifth transistor and ground, said third and said fourth n-type transistors having their gates coupled together such that when their gates are raised to a positive potential said second internal margin potential is transferred to said node to verify that said cells have been erased.

* * * * *

UNITED STATES PATENT AND TRADEMARK OFFICE
CERTIFICATE OF CORRECTION

PATENT NO. : 4,875,188
DATED : 10/17/89
INVENTOR(S) : Jungroth

It is certified that error in the above-identified patent and that said Letters Patent is hereby corrected as shown below:

| | |
|---|---|
| col. 01, line 41 | after "memories" (1st occurence) insert --are-- |
| col. 02, line 65 | delete "nwells" insert --n-wells-- |
| col 03, line 02 | delete "110°" insert --110Å--. |
| col. 05, line 66 | after "EPROM" insert --"-- |
| col. 03, line 50 | insert after "R2"-- $V_{PI} = V_{PP} \dfrac{R_2}{R_1+R_2+R_3}$ -- |

Signed and Sealed this

Twentieth Day of August, 1991

Attest:

HARRY F. MANBECK, JR.

*Attesting Officer*      *Commissioner of Patents and Trademarks*